(12) United States Patent
Li et al.

(10) Patent No.: US 11,837,847 B2
(45) Date of Patent: Dec. 5, 2023

(54) DFB LASER DC-COUPLED OUTPUT POWER CONFIGURATION SCHEME

(71) Applicant: XIAMEN EOCHIP SEMICONDUCTOR CO., LTD, Xiamen (CN)

(72) Inventors: Jinghu Li, Xiamen (CN); Zhang Fan, Xiamen (CN); Liangqiong Shi, Xiamen (CN); Weitan Yao, Xiamen (CN); Weiyin Zheng, Xiamen (CN); Hanghui Tu, Xiamen (CN)

( * ) Notice: Subject to any disclaimer, the term of this patent is extended or adjusted under 35 U.S.C. 154(b) by 0 days.

(21) Appl. No.: 18/246,906

(22) PCT Filed: Dec. 24, 2021

(86) PCT No.: PCT/CN2021/141108
§ 371 (c)(1),
(2) Date: Mar. 28, 2023

(87) PCT Pub. No.: WO2023/108791
PCT Pub. Date: Jun. 22, 2023

(65) Prior Publication Data
US 2023/0291175 A1 Sep. 14, 2023

(51) Int. Cl.
*H04B 10/00* (2013.01)
*H01S 5/042* (2006.01)
*H01S 5/12* (2021.01)

(52) U.S. Cl.
CPC .............. *H01S 5/0427* (2013.01); *H01S 5/12* (2013.01)

(58) Field of Classification Search
CPC ........ H01S 5/0427; H01S 5/12; H04B 10/564
See application file for complete search history.

(56) References Cited

U.S. PATENT DOCUMENTS

| 5,317,443 | A | * | 5/1994 | Nishimoto | ............. | H04B 10/54 |
| | | | | | | 398/32 |
| 2002/0063930 | A1* | | 5/2002 | Blauvelt | .............. | H04B 10/504 |
| | | | | | | 398/192 |

(Continued)

FOREIGN PATENT DOCUMENTS

CN 111193185 A 5/2020

*Primary Examiner* — Agustin Bello
(74) *Attorney, Agent, or Firm* — Novoclaims Patent Services LLC; Mei Lin Wong

(57) ABSTRACT

A DFB laser DC-coupled output power configuration scheme belongs to the field of laser drivers in optical communication integrated circuits. The present invention solves the existing problems in the conventional DFB laser power supply configuration scheme. The power configuration scheme of the present invention utilizes an external or internal power configuration unit to provide two electric DC power supplies with a fixed voltage difference for the transmitting unit TX of the DFB laser and the optical transceiver integrated chip, and at the same time optimizes the transmitting unit TX. The optimization scheme is that: the transistors in the transmitting unit TX are all low-voltage high-speed tubes, the transmitting unit TX includes a negative capacitance structure composed of capacitors C1 and C2, serving as an auxiliary structure for improving bandwidth. After optimization, the minimum voltage of the power supply voltage port TVCC of the transmitting unit TX is 2.7V.

10 Claims, 9 Drawing Sheets

(56) References Cited

U.S. PATENT DOCUMENTS

| | | | | |
|---|---|---|---|---|
| 2004/0008083 | A1* | 1/2004 | Zhou | H03F 1/3276 |
| | | | | 330/149 |
| 2004/0262491 | A1* | 12/2004 | Posamentier | G01J 1/4257 |
| | | | | 250/214 R |
| 2007/0009267 | A1* | 1/2007 | Crews | H04B 10/504 |
| | | | | 398/182 |
| 2009/0245807 | A1* | 10/2009 | Nomura | H04B 10/6931 |
| | | | | 359/333 |
| 2013/0302039 | A1* | 11/2013 | Wang | H04B 10/25137 |
| | | | | 398/192 |
| 2017/0063030 | A1* | 3/2017 | Yan | H01S 5/125 |
| 2020/0169175 | A1* | 5/2020 | Chen | H02M 1/08 |
| 2021/0226411 | A1* | 7/2021 | Miura | H01S 5/0092 |

* cited by examiner

DFB LASER DC-COUPLED OUTPUT POWER CONFIGURATION SCHEME

FIELD OF INVENTION

The present invention relates to o a low-cost, high-performance DFB laser DC-coupled output power configuration scheme, which belongs to the field of laser driver in optical communication integrated circuit.

DESCRIPTION OF RELATED ARTS

At the transmitting end of the optical fiber communication integrated circuit, the laser driver (Laser Diode Driver) turns on or off the laser according to a logic value of the data stream and uses an optical fiber to transmit the optical signal over a long distance, the receiving end then converts the current signal into a voltage signal through a transimpedance amplifier (TIA). As shown in FIG. 2, the laser (Laser Diode) must be biased near the threshold $I_{th}$ so that the laser current increases rapidly to switch on the laser. Referring to FIG. 1, a circuit schematic diagram of the commonly used laser driver DC-coupled laser circuit is illustrated. The laser driver must provide a bias current ($I_{bias}$) and a modulation current ($I_{mod}$). The bias current of the laser needs to be continuously adjusted for temperature changes and aging, and the modulation current also needs to change the luminous efficiency (ER) of the laser.

FIG. 3 illustrates a conventional DFB laser configuration scheme with an external 3.3V power supply.

DFB (Distributed Feedback Laser, distributed feedback) laser can provide a relatively high output power, and is suitable for high-speed long-distance optical signal transmission. The high-speed optical transceiver integrated chip (Transceiver) is connected to the DFB laser by means of DC coupling. The advantages of the DC coupling method of the laser compared with the AC coupling method are as follows: (1) DC coupling has no time delay caused by AC coupling capacitors, faster response speed, and multi-rate compatibility, which can be used in applications in ultra-high-speed optical transmitters and burst optical transmitters. (2) The DC coupling uses a lower bias current and the modulation current can be used as the average power output, so its power consumption is lower. (3) Fewer peripheral devices, and easier impedance matching.

However, the problem of headroom voltage brought about by the DC coupling method is also more prominent. In the case of high-speed switching of laser, the laser needs a forward voltage $V_F$ (Forward-bias Voltage) of about 1.2V-1.8V. As shown in FIG. 3, which illustrates a simplified laser equivalent circuit, the forward voltage $V_F$ is equal to the sum of the voltage drop across the bandgap voltage $V_{BG}$ and the equivalent series resistance $R_L$ of the laser, and the formula is:

$$V_F = V_{BG} + R_L \cdot I$$

At room temperature, the $V_{BG}$ of the DFB laser is about 0.7V, the $R_L$ is equal to 5Ω, the input current of the forward voltage terminal is $I = I_{bias} + I_{mod} = 35$ mA+80 mA=115 mA, so $V_F = 1.275V$.

The transient voltage drop $V_L$ is caused by the rapidly changing current through the laser package parasitic inductance L. The package inductance L of a 10 Gbps DFB laser is about 0.4 nH, the time of increasing and decreasing 20%-80% of the 80 mA modulation current is 20 ps, and the effective modulation current is 60%*80 mA=48 mA, according to the formula:

$$V_L = L \frac{\Delta i}{\Delta t}$$

Calculate $V_L = 0.96V$. $\Delta i$ is the variation of the modulation current per unit time, that is, 48 mA. $\Delta t$ is the unit time, which is 20 ps.

The modulation current flowing through the damping resistor $R_A$ also produces a voltage drop: $V_{RA} = R_A * I_{mod} = 5Ω*80$ mA=0.4V.

In the case of high-power output of the laser, the voltage of the OUTP terminal of the transmitting unit TX in the optical transceiver integrated chip will drop to the lowest point, and its expression is:

$$V_{LOW} = LVCC - V_F - V_L - V_{RA}$$

where LVCC is the power supply voltage of the DFB laser, when the value is 3.3V, $V_{LOW} = 3.3 - 1.275 - 0.96 - 0.4 = 0.665V$.

At room temperature, when using the conventional DFB laser configuration scheme with external 3.3V power supply as shown in FIG. 4, the power supply voltage TVCC of the transmitting unit TX in the optical transceiver integrated chip (Transceiver) and the power supply voltage LVCC of the DFB laser are both 3.3V, then the slew voltage of the OUTP terminal of the transmitting unit TX is 0.665V. This voltage is already close to the sum 0.6V of the collector-emitter voltage of the internal device under high-speed operation. When the operating temperature is further increased to 85° C., the modulation current and bias current of the DFB laser will increase, then the slew voltage of the OUTP terminal will be less than 0.6V, and the internal device cannot respond to the switching of the data stream at a high speed, the quality of the eye diagram is cracked, and the transimpedance amplifier TIA at the receiving end cannot correctly receive the optical signal.

FIG. 10 is an output eye diagram of the conventional DFB laser configuration scheme with an external 3.3V power supply at room temperature of 25° C., the output power is +5.5 dBm, and the eye opening margin Margin=38.6%.

FIG. 11 is an output eye diagram of the conventional DFB laser configuration scheme with an external 3.3V power supply at a high temperature of 85° C., the output power is +4.5 dBm, and the eye opening margin Margin=13.9%.

FIG. 12 is an output eye diagram of the conventional DFB laser configuration scheme with an external 3.3V power supply at a low temperature of −40° C., the output power is +6 dBm, and the eye opening margin Margin=23.2%.

It can be seen that at high temperature, the output power of the DBF laser is low, and the eye opening margin is only 13.9%, which cannot meet the performance requirements of optical transmission in extreme environments.

In order to solve the above-mentioned headroom voltage problem, the most simple and effective method is to increase the power supply voltage LVCC of the DFB laser. As shown in FIG. 5, the conventional DFB laser configuration scheme with an external DC/DC boost module is illustrated. In this scheme, a DC/DC boost module is added outside the optical transceiver integrated chip, and the conventional voltage of 3.3V is raised to 4V as the power supply voltage LVCC of the DFB laser, while the power supply voltage TVCC of the transmitting unit TX still uses the 3.3V. In this case, there is still a considerable voltage margin from the sum 0.6V of the collector-emitter voltages under the high-speed operation of the internal devices to meet the performance requirements of high temperature operation. As the modulation current bias current increases, Wow decreases further and the performance requirements of the output eye quality without cracking is met.

In practical applications, although the conventional DFB laser configuration scheme with an external 3.3V power supply is simple to implement, the laser driver fails to switch the DFB laser at high speed to emit high-quality transmission light due to insufficient headroom voltage margin when working in a high temperature environment. On the other hand, by using the conventional DFB laser configuration scheme with an external DC/DC boost module, the DFB laser can finally output high-quality transmitted light under high temperature conditions. However, this configuration scheme adds many peripheral circuits, increases the difficulty of debugging, increases the power consumption, and most importantly, dramatically increases the economic cost.

SUMMARY OF THE PRESENT INVENTION

An object of the present invention is to solve the existing problems in the conventional DFB laser power supply configuration scheme, and provide a DFB laser DC-coupled output power configuration scheme. This power supply has low cost and high performance.

According to the DFB laser DC-coupled output power configuration scheme of the present invention, the power configuration scheme adopts an external power configuration unit to provide two electric DC power supplies with a fixed voltage difference to a DFB laser and a transmitting unit TX of an optical transceiver integrated chip, the external power configuration unit comprises a DC voltage source VDC3.3V and a voltage difference generating component, and a positive terminal of the DC voltage source VDC is connected to both one end of the voltage difference generating component and a power supply voltage port LVCC of the DFB laser DFB_Laser;

a negative terminal of the DC voltage source VDC is grounded;

another end of the voltage difference generating component is connected to a power supply voltage port TVCC of the transmitting unit TX of the optical transceiver integrated chip;

the power configuration scheme optimizes the transmitting unit TX at the same time, the optimization scheme is that: the transmitting unit TX comprises transistors which are all low-voltage high-speed tubes, and the transmitting unit TX comprises a negative capacitance structure composed of capacitors C1 and C2 serving as an auxiliary structure for improving bandwidth;

after optimization, a minimum voltage of the power supply voltage port TVCC of the transmitting unit TX is 2.7V.

Preferably, the voltage difference generating component is a resistor $R_D$, a voltage difference value $VR_D$ generated by the resistor $R_D$ is between 100 mV-600 mV, and a voltage of the power supply voltage port TVCC of the transmitting unit TX is $3.3V-VR_D$;

the resistor $R_D$ is a single resistor, or is composed of multiple resistors connected in series, in parallel, or in series and parallel.

Preferably, the voltage difference generating component is a Schottky diode SBD; a voltage difference value $VF_{SBD}$ generated by the Schottky diode SBD is between 100 mV-600 mV, and a voltage of the power supply voltage port TVCC of the transmitting unit TX is $3.3V-VF_{SBD}$;

the Schottky diode SBD is a single tube, or is composed of multiple Schottky diodes connected in series or in parallel.

The preset invention also provides another technical solution. The DFB laser DC-coupled output power configuration scheme of the present invention is:

Utilize a DC voltage source VDC3.3V as a working power supply of a DFB laser;

At the same time, arrange an internal power configuration unit inside an optical transceiver integrated chip. The working power supply of a transmitting unit TX of the optical transceiver integrated chip is obtained from the DC voltage source VDC3.3V after being processed by the internal power supply configuration unit.

In order to realized that: the working power supply of the transmitting unit TX of the optical transceiver integrated chip and the working power supply of the DFB laser DFB_Laser have a fixed voltage difference;

specifically: a positive terminal of the DC voltage source VDC3.3V is both connected to a power supply voltage port LVCC of the DFB laser DFB_Laser and a power supply voltage port TVCC of the transmitting unit TX of the optical transceiver integrated chip; a negative terminal of the DC voltage source VDC3.3V is grounded; an input terminal of an internal power configuration unit is connected to the power supply voltage port TVCC of the transmitting unit TX, an output terminal of the internal power configuration unit is connected to an internal working power port VCCT of the transmitting unit TX, a voltage differential modulation terminal of the internal power configuration unit is connected to a modulation port CTL of the transmitting unit TX;

the power configuration scheme optimizes the transmitting unit TX at the same time, the optimization scheme is that: the transmitting unit TX comprises transistors which are all low-voltage high-speed tubes, and the transmitting unit TX comprises a negative capacitance structure composed of capacitors C1 and C2 serving as an auxiliary structure for improving bandwidth;

after optimization, a minimum voltage of the internal power supply voltage port VCCT of the transmitting unit TX is 2.7V.

Preferably, the internal power supply configuration unit comprises a voltage difference generating component and a programmable module, an input terminal of the voltage difference generating component is connected to the power supply voltage port TVCC of the transmitting unit TX, an output terminal of the voltage difference generating component is connected to the internal working power port VCCT of the transmitting unit TX, a voltage difference modulation terminal of the voltage difference generating component is connected to a command output terminal of the programmable module, a command input terminal of the programmable module is connected to a modulation port CTL of the transmitting unit TX, and a voltage difference generated by the voltage difference generating component is adjusted externally by a command input through the modulation port CTL.

Preferably, the voltage difference generating component is a resistor $R_D$, a voltage difference value $VR_D$ generated by the resistor $R_D$ is between 100 mV-600 mV, and a voltage of the internal power supply voltage port VCCT of the transmitting unit TX is $3.3V-VR_D$.

Preferably, the voltage difference generating component is a Schottky diode SBD; a voltage difference value $VF_{SBD}$ of the voltage difference generating component is between 100 mV-600 mV, and a voltage of the internal power supply voltage port VCCT of the transmitting unit TX is 3.3V−VF$_{SBD}$.

Preferably, a resistance value of the resistor R$_D$ or a voltage difference between two ends of the Schottky diode SBD is rewritten by the programmable module to realize an adjustment of the voltage difference between the two working power supplies, the programmable module adopts analog programmable module or digital programmable module.

Preferably, the digital programmable module is realized by a one-time programmable OTP or register programming, and a process of voltage difference adjustment is: first determine a pre-realized voltage difference value between the two working power supplies, then write digital characters as commands through the modulation port CTL of the transmitting unit TX, the resistance value of the resistor R$_D$ or the voltage difference between the two ends of the Schottky diode SBD are rewritten by the programmable module according to this command, and hence the voltage difference adjustment is realized.

Preferably, the analog programmable modules is realized by laser trimming or fuse trimming.

The advantageous effect of the present invention: The present invention provides a low-cost and high-performance DFB laser DC-coupled output power configuration scheme, which abandons the traditional 3.3V power supply voltage configuration scheme that simultaneously supplies the transmitting unit TX inside the transceiver integrated chip and the DFB laser power supply voltage, and abandon the 3.3V power supply voltage to supply the transmitter unit TX inside the optical transceiver integrated chip and the configuration scheme of using the boost chip DC/DC to output 4V voltage to the DFB laser power supply voltage, and adopts an optimized internal design: the transmitter (TX) of the optical transceiver integrated chip works at a power supply voltage lower than 3.3V, and the laser power supply voltage is 3.3V (a fixed voltage difference is generated between TVC and LVCC), which can improve the eye diagram performance of the laser under high temperature condition, and reduce the cost and power consumption of the entire module at the same time, and has been verified by practical testings.

DETAILED DESCRIPTION OF THE PREFERRED EMBODIMENT

Embodiment 1: This embodiment is described below with reference to FIGS. 6, 7, 10-13. According to the DFB laser DC-coupled output power configuration scheme of this embodiment, this configuration scheme includes two parts, one part is the design of the external power supply configuration unit structure, and the other part is the optimization of the transmitting unit TX of the optical transceiver integrated chip.

Figure 6:
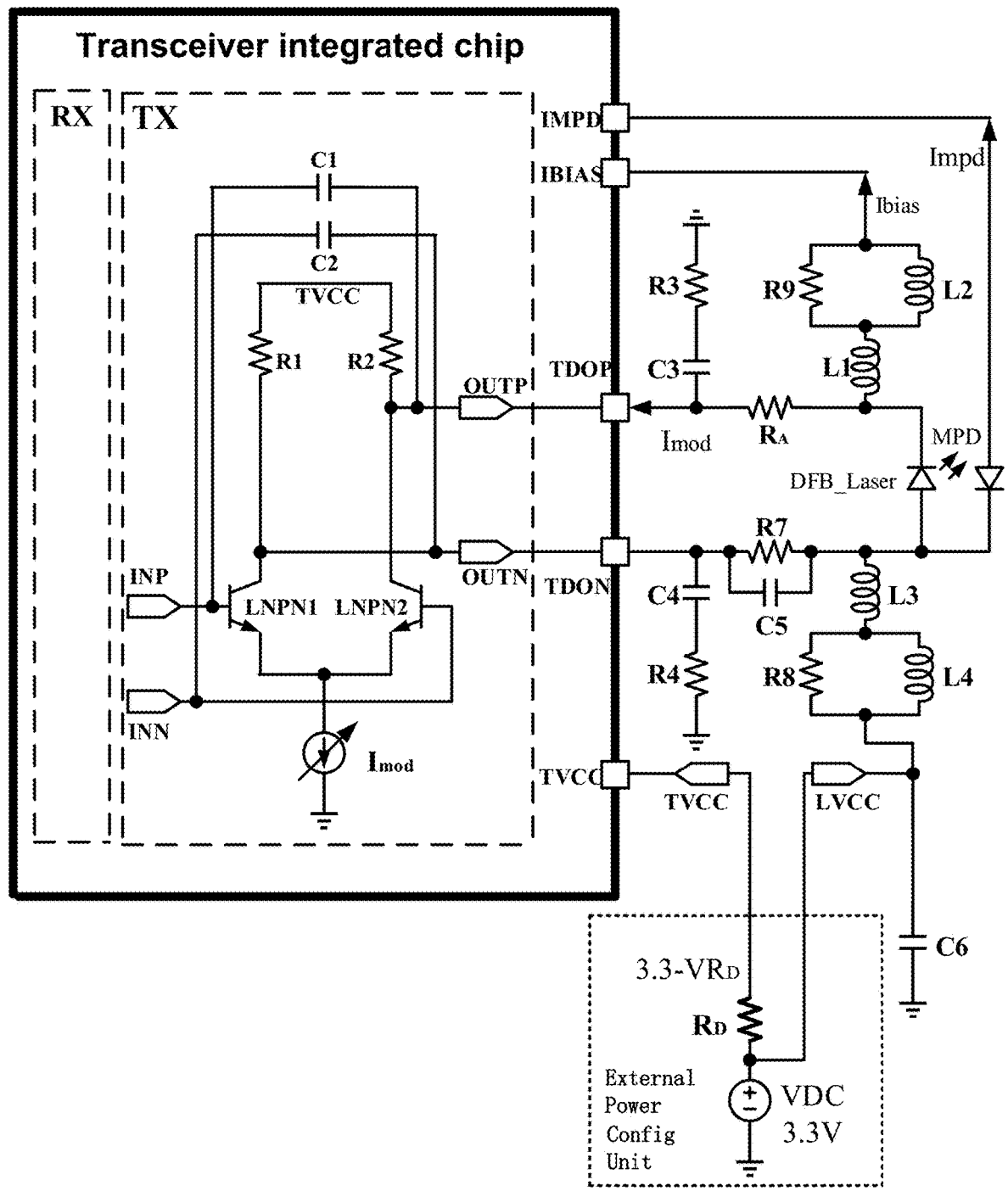
FIG. 6 is a schematic diagram of the structure of DC-coupled output power supply of a DFB laser (configuration scheme 1) according to the present invention.
Figure 7:
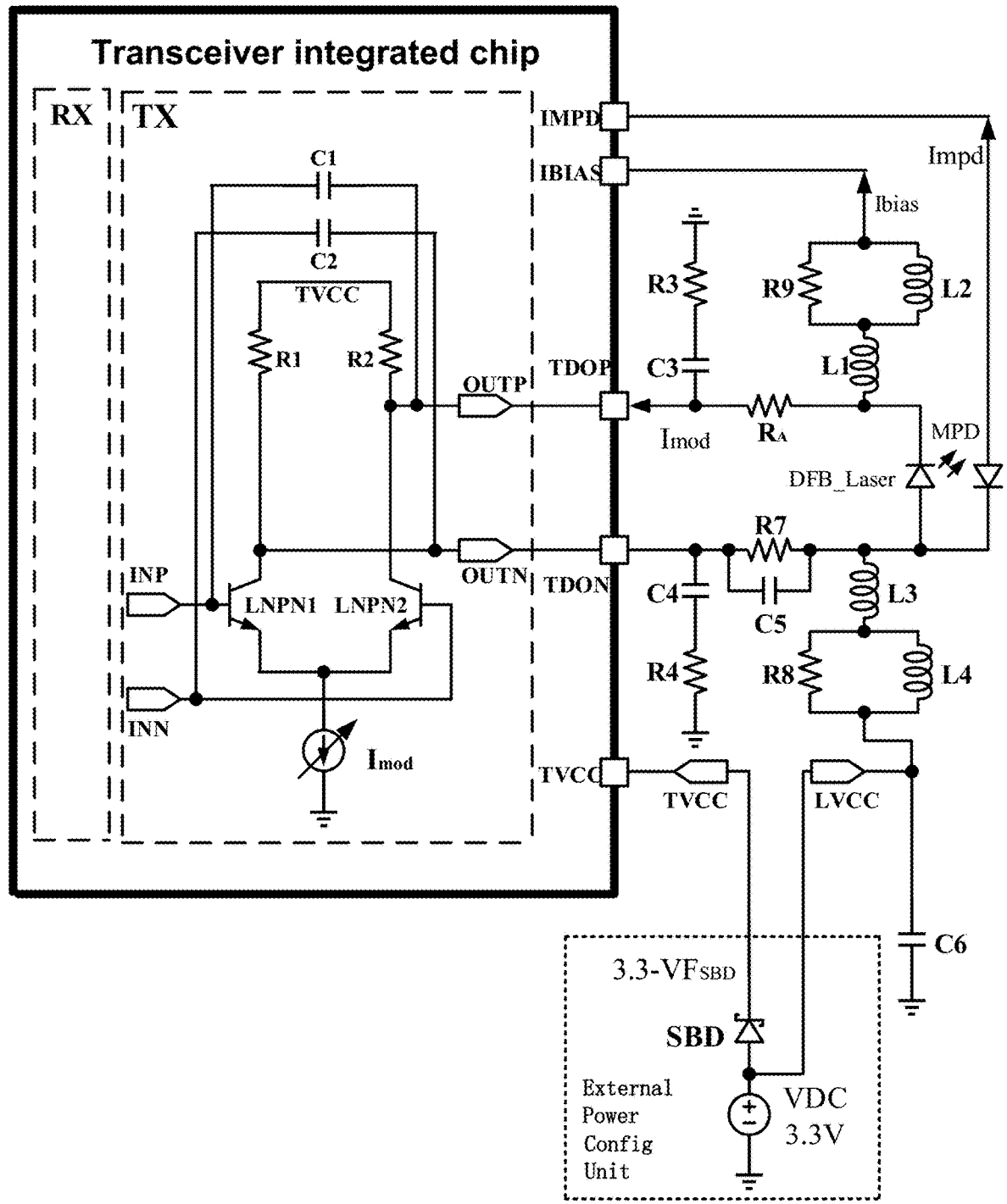
FIG. 7 is a schematic diagram of the structure of DC-coupled output power supply of a DFB laser (configuration scheme 2) according to the present invention.

The external power supply configuration unit has two outputs, one output 3.3V is connected to the power supply voltage port LVCC of the DFB laser DFB_Laser, and the other output is 3.3V-V$_{R4}$ (or VF$_{SBD}$). Referring to FIG. 6 and FIG. 7, the DFB laser DFB_Laser and its control circuit include resistors R$_4$, R$_3$, R$_4$, R$_7$~R$_9$, C3~C5, and L1~L5. The optical transceiver integrated chip includes a transmitting unit TX and a receiving unit RX, wherein the simple principle circuit of the last stage of the transmitting unit TX includes transistors LNPN1, LNPN2, capacitor C1, capacitor C2, resistors R1, R2, current supply I$_{mod}$, a power supply terminal TVCC of the optical transceiver integrated chip, and the power supply terminal LVCC of the DFB laser.

The external power supply configuration unit in this embodiment includes a DC voltage source VDC3.3V and a voltage difference generating component, and a positive terminal of the DC voltage source VDC is connected to both one end of the voltage difference generating component and a power supply voltage port LVCC of the DFB laser DFB_Laser;

a negative terminal of the DC voltage source VDC is grounded;

another end of the voltage difference generating component is connected to a power supply voltage port TVCC of the transmitting unit TX of the optical transceiver integrated chip;

the power configuration scheme optimizes the transmitting unit TX at the same time, the optimization scheme is that: the transmitting unit TX comprises transistors which are all low-voltage high-speed tubes, and the transmitting unit TX comprises a negative capacitance structure composed of capacitors C1 and C2 serving as an auxiliary structure for improving bandwidth;

after optimization, a minimum voltage of the power supply voltage port TVCC of the transmitting unit TX is 2.7V.

According to the different voltage difference generating components, there are the following two configurations.

Configuration scheme 1: the voltage difference generating component is a resistor $R_D$, a voltage of the power supply voltage port TVCC of the transmitting unit TX is 3.3V–$VR_D$, that is a fixed voltage difference existed between TVCC and LVCC. The voltage difference value $VR_D$ generated by the resistor $R_D$ is between 100 mV-600 mV.

The resistor $R_D$ is a single resistor, or is composed of multiple resistors connected in series, in parallel, or in series and parallel.

Configuration scheme 2: the voltage difference generating component is a Schottky diode SBD; a voltage of the power supply voltage port TVCC of the transmitting unit TX is 3.3V–$VF_{SBD}$, that is a fixed voltage difference existed between TVCC and LVCC. The voltage difference value $VF_{SBD}$ generated by the Schottky diode SBD is between 100 mV-600 mV.

The Schottky diode SBD is a single tube, or is composed of multiple Schottky diodes connected in series or in parallel.

The key points of this embodiment are low cost and high performance.

In explaining the traditional laser power configuration scheme, if a unified 3.3V voltage is used to supply the chip and the laser, it will cause the problem of headroom voltage, which will affect the output quality of the eye diagram under high temperature conditions. If the laser is powered by boosting, the peripheral devices of this solution will increase, and the power consumption and cost will also increase. The low-cost and high-performance power supply configuration scheme proposed in FIG. 6 can well solve the above two problems, that is, superior performance and low cost.

Figure 1:
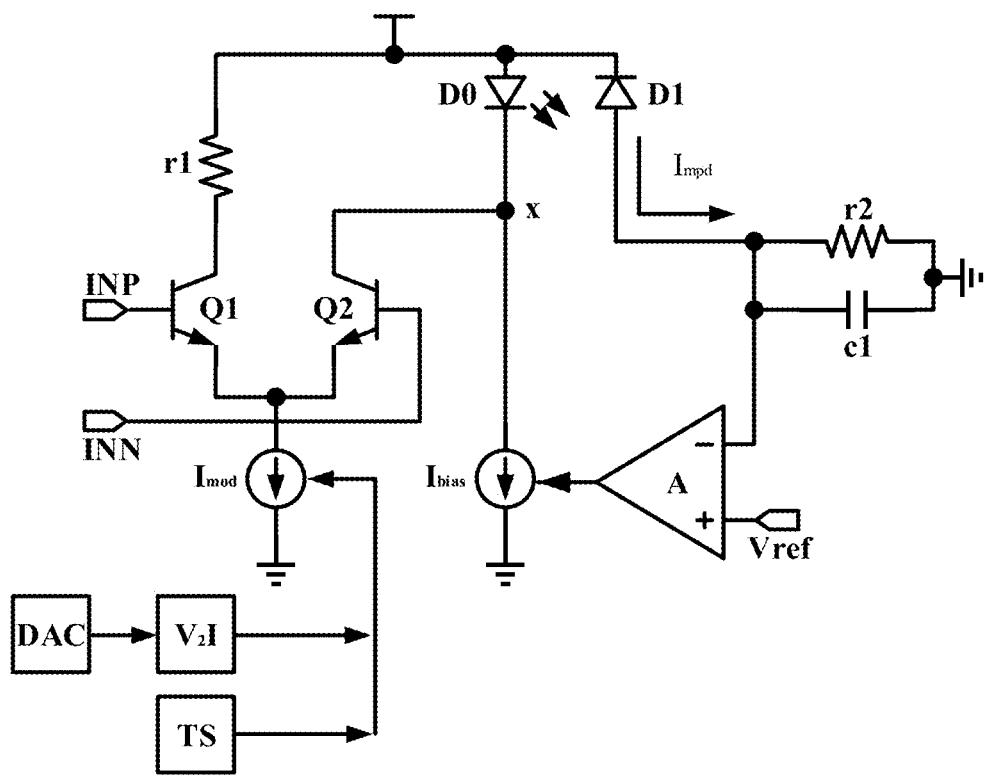
FIG. 1 is a schematic diagram of a commonly used laser driver DC-coupled laser circuit.
Figure 2:
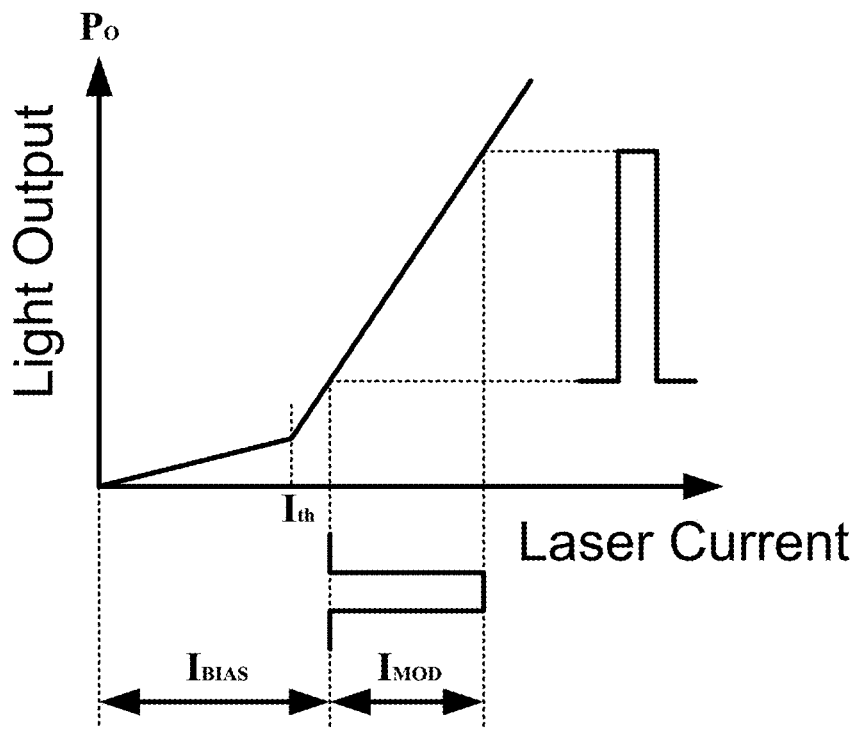
FIG. 2 is a schematic diagram of the input and output characteristics of a laser.
Figure 3:
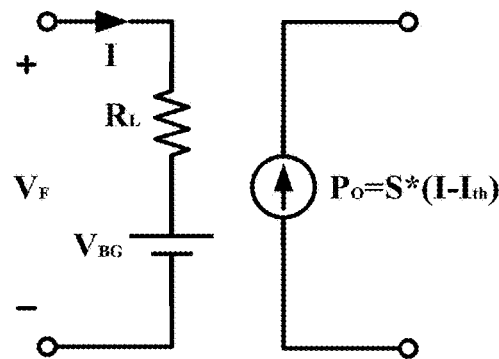
FIG. 3 is simplified laser equivalent circuit diagram.
Figure 4:
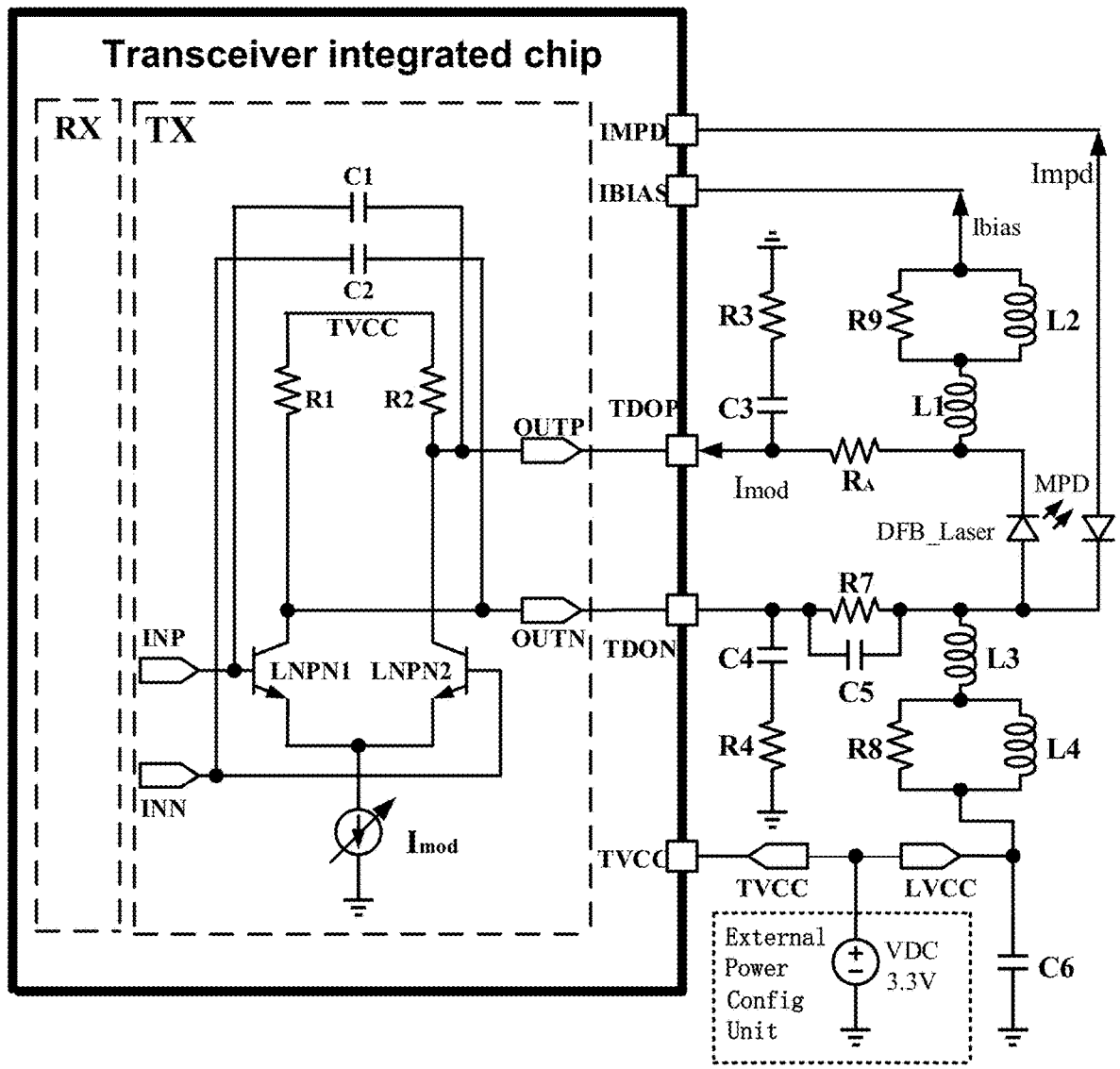
FIG. 4 is a conventional DFB laser configuration scheme with an external 3.3V power supply.
Figure 5:
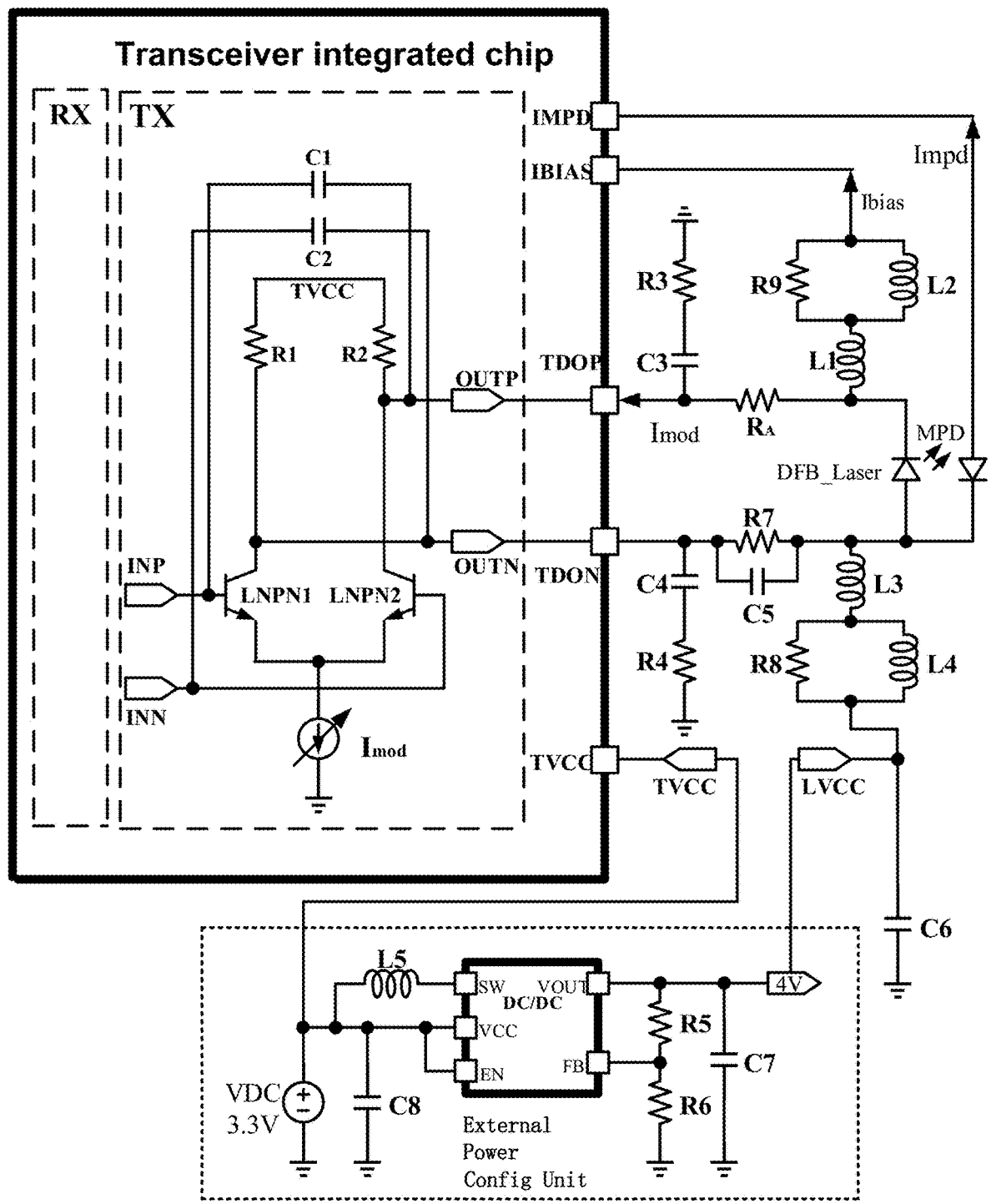
FIG. 5 is a conventional DFB laser configuration scheme with an external DC/DC boost module.

The conventional power configuration scheme shown in FIG. 5 is to increase the power supply voltage of the laser, so that the headroom voltage margin is larger to improve the high temperature performance. The design idea of FIG. 6 is the opposite. The power supply voltage of the laser still adopts the conventional 3.3V voltage, and the power supply voltage of the chip transmitter unit TX is connected to the power supply voltage port TVC of the chip transmitter unit by connecting a small resistor $R_D$ in series with the conventional 3.3V voltage. The voltage value of TVCC is 3.3V–$VR_D$. $VR_D$ is the overall consumption current of the transmitting unit TX multiplied by the resistance value of the resistor $R_D$. The range of the voltage difference $VR_D$ can be between 100 mV and 600 mV, and the optimal voltage difference can be selected within this range in exchange for the best eye diagram performance of the laser under high temperature condition.

After the power supply voltage of the chip transmitting unit TX is 3.3V–$VR_D$, the sum of the voltage between the collector and the emitter will further drop by several hundred millivolts under the condition of high-speed operation of its internal devices, which is lower than the 0.6V mentioned above. Then, when the laser works at high temperature, after the modulation current bias current increases, there is still a certain headroom voltage margin, so that the laser driver can turn on and off the laser at high speed and emit high-quality light.

In order to realize the design concept of this configuration scheme, the circuit of the chip transmitting unit TX should be optimized at the beginning of the chip design, so that it can still turn on and off the laser at high speed with the data flow under low power supply voltage. For example, the transistor in the circuit adopts a low-voltage high-speed transistor LNPN, and adopts an auxiliary structure to increase the bandwidth (the connection of capacitors C1 and C2 forms a negative capacitance structure to improve the working speed), etc.

Figure 13:
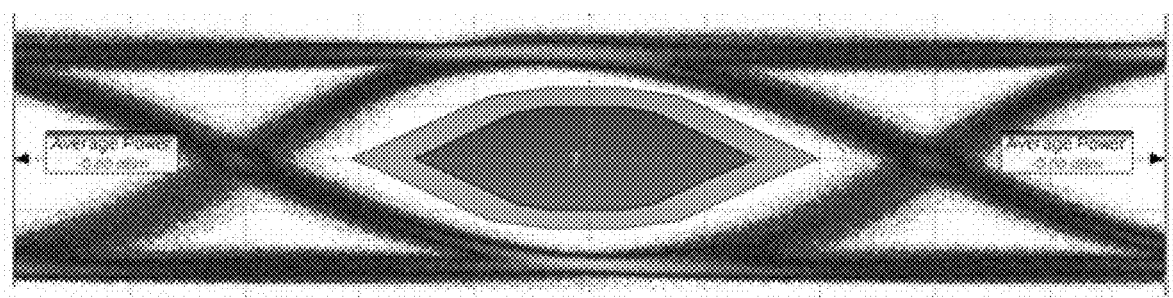
FIG. 13 is an output eye diagram of a low cost and high performance DFB laser DC-coupled output power configuration scheme 1 at 25° C.

FIG. 13 is an output eye diagram of a low cost and high performance DFB laser DC-coupled output power configuration scheme 1 at room temperature of 25° C., the output power is +6.8 dBm, and the eye opening margin Margin=36.4%.

Figure 14:
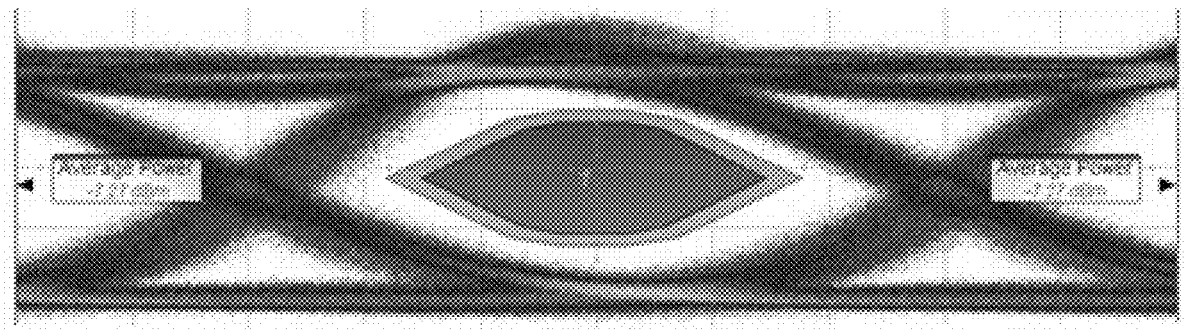
FIG. 14 is an output eye diagram of a low cost and high performance DFB laser DC-coupled output power configuration scheme 1 at 85° C.

FIG. 14 is an output eye diagram of a low cost and high performance DFB laser DC-coupled output power configuration scheme 1 under high temperature of 85° C., the output power is +7 dBm, and the eye opening margin Margin=20.7%.

Figure 15:
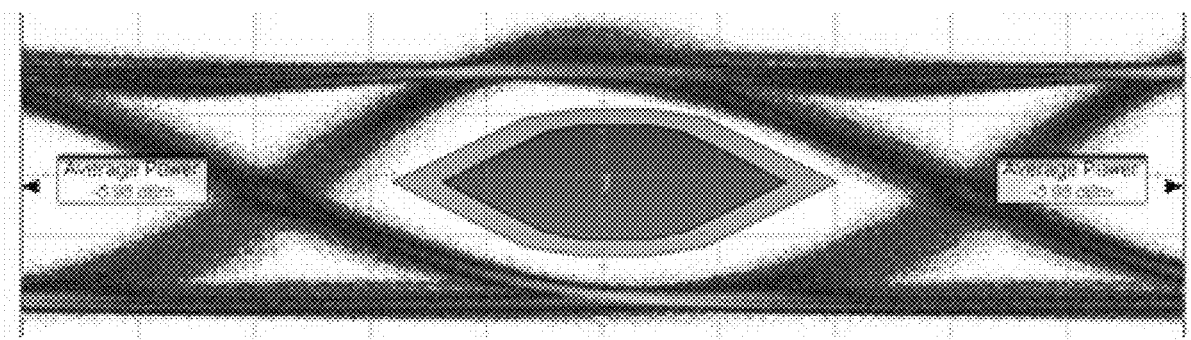
FIG. 15 is an output eye diagram of a low cost and high performance DFB laser DC-coupled output power configuration scheme 1 at −40° C.

FIG. 15 is an output eye diagram of a low cost and high performance DFB laser DC-coupled output power configuration scheme 1 under low temperature of –40° C., the output power is +7 dBm, and the eye opening margin Margin=28.8%.

Compared with the test data of the unified 3.3V power supply voltage, the test data of this embodiment has an overall increase of about 1 dBm in the three-temperature power, the output eye diagram is better, and there is no obvious overshoot problem, especially under the high temperature of 85° C., the eye opening margin is 20.7%, and the performance is improved.

The configuration scheme in FIG. 7 is another extension of this design idea, that is, a Schottky diode SBD is used to replace the small resistor $R_D$ in FIG. 6 to reduce the voltage of TVCC, and the forward conduction voltage of the Schottky diode is about 0.15V-0.45V. The TVCC voltage after reduction can still make the chip transmitting unit TX work at high speed.

The low-cost and high-performance DFB laser DC-coupled output power supply configuration scheme provided by the present invention does not use the conventional boost chip to supply power to the laser to improve the headroom voltage margin, but uses a small resistor or Schottky diode to reduce the TX power supply voltage to reversely increases the headroom voltage margin. The above changes in the power configuration scheme can reduce the power consumption and cost of the entire module, and improve the quality of the laser output eye diagram.

Embodiment 2: This embodiment is described below with reference to FIGS. 8 and 9. According to the DFB laser DC-coupled output power configuration scheme of this embodiment, this configuration scheme includes two parts, one part is the design of the internal power supply configuration unit structure, and the other part is the optimization of the transmitting unit TX of the optical transceiver integrated chip.

Figure 8:
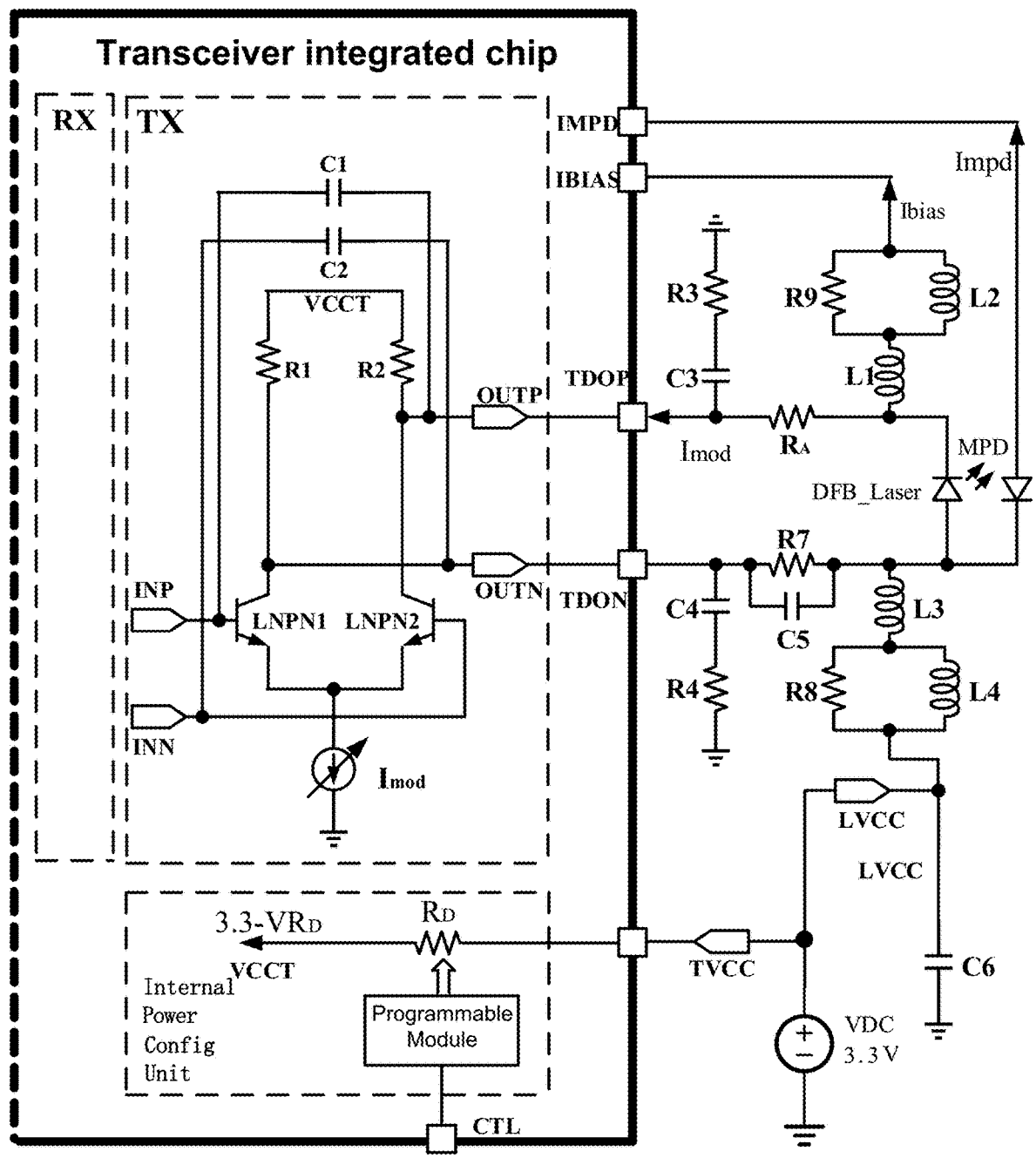
FIG. 8 is a schematic diagram of the structure of DC-coupled output power supply of a DFB laser (configuration scheme 3) according to the present invention.
Figure 9:
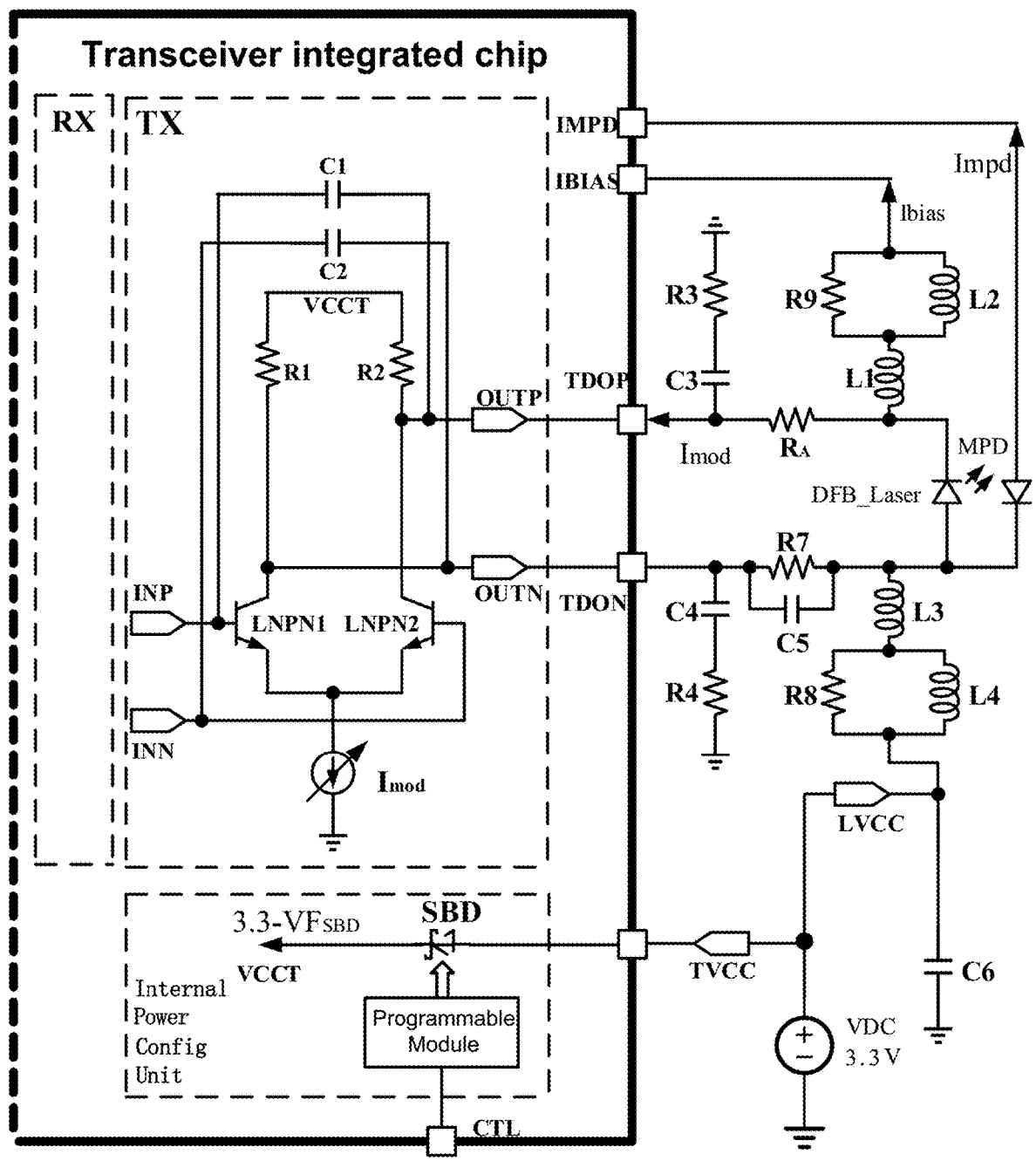
FIG. 9 is a schematic diagram of the structure of DC-coupled output power supply of a DFB laser (configuration scheme 4) according to the present invention.
Figure 10:
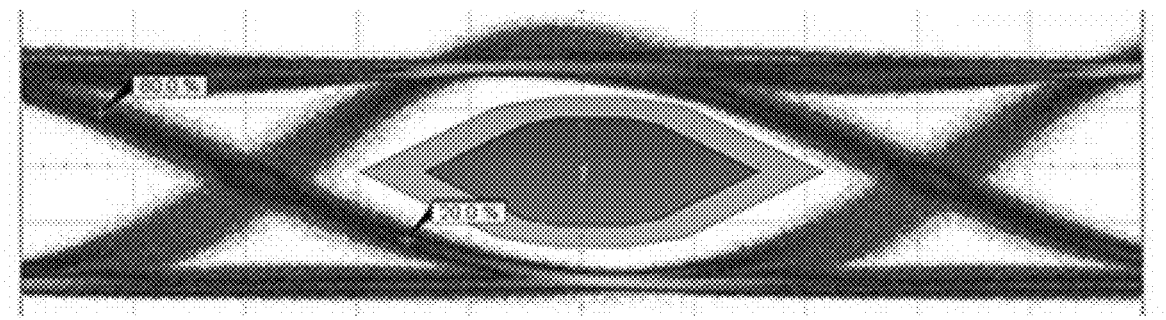
FIG. 10 is an output eye diagram of the conventional DFB laser configuration scheme with an external 3.3V power supply at 25° C. condition.
Figure 11:
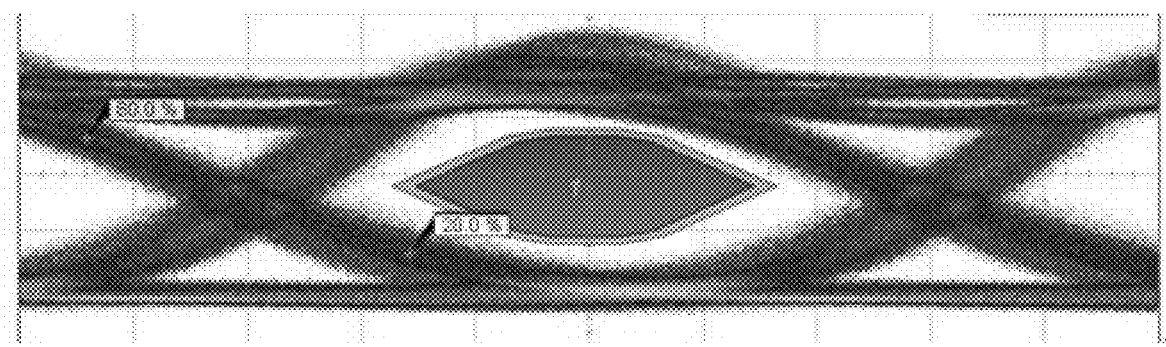
FIG. 11 is an output eye diagram of the conventional DFB laser configuration scheme with an external 3.3V power supply at 85° C. condition.
Figure 12:
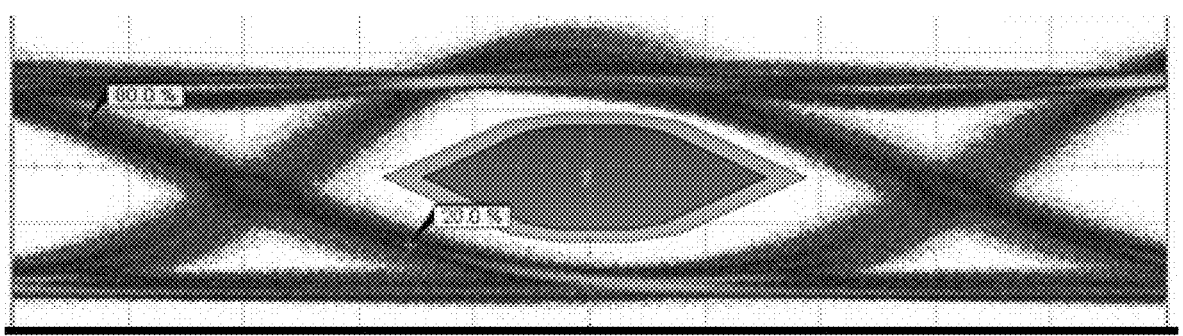
FIG. 12 is an output eye diagram of the conventional DFB laser configuration scheme with an external 3.3V power supply at −40° C. condition.

Referring to FIGS. 8 and 9, the power configuration scheme is:

Utilize a DC voltage source VDC3.3V as a working power supply of a DFB laser;

At the same time, arrange an internal power configuration unit inside an optical transceiver integrated chip. The working power supply of a transmitting unit TX of the optical transceiver integrated chip is obtained from the DC voltage source VDC3.3V after being processed by the internal power supply configuration unit.

In order to realized that: the working power supply of the transmitting unit TX of the optical transceiver integrated chip and the working power supply of the DFB laser DFB_Laser have a fixed voltage difference.

The specific connection relationship of each component is as follows: a positive terminal of the DC voltage source VDC3.3V is both connected to a power supply voltage port LVCC of the DFB laser DFB_Laser and a power supply voltage port TVCC of the transmitting unit TX of the optical transceiver integrated chip; a negative terminal of the DC voltage source VDC3.3V is grounded; an input terminal of an internal power configuration unit is connected to the power supply voltage port TVCC of the transmitting unit TX, an output terminal of the internal power configuration unit is connected to an internal working power port VCCT of the transmitting unit TX, a voltage differential modulation terminal of the internal power configuration unit is connected to a modulation port CTL of the transmitting unit TX.

The power configuration scheme optimizes the transmitting unit TX at the same time, the optimization scheme is that: the transmitting unit TX comprises transistors which are all low-voltage high-speed tubes, and the transmitting unit TX comprises a negative capacitance structure composed of capacitors C1 and C2 serving as an auxiliary structure for improving bandwidth.

After optimization, a minimum voltage of the internal power supply voltage port VCCT of the transmitting unit TX is 2.7V.

The internal power supply configuration unit comprises a voltage difference generating component and a programmable module, an input terminal of the voltage difference generating component is connected to the power supply voltage port TVCC of the transmitting unit TX, an output terminal of the voltage difference generating component is connected to the internal working power port VCCT of the transmitting unit TX, a voltage difference modulation terminal of the voltage difference generating component is connected to a command output terminal of the programmable module, a command input terminal of the programmable module is connected to a modulation port CTL of the transmitting unit TX, and a voltage difference generated by the voltage difference generating component is externally adjusted by a command input through the modulation port CTL.

Referring to the configuration scheme 3 as shown in FIG. 8, the voltage difference generating component is a resistor $R_D$, a voltage difference value $VR_D$ generated by the resistor $R_D$ is between 100 mV-600 mV, and a voltage of the internal power supply voltage port VCCT of the transmitting unit TX is $3.3V-VR_D$. The configuration scheme of FIG. 8 is an extension of the configuration scheme of FIG. 6, that is, the external power configuration unit is placed inside the optical transceiver integrated chip to form an internal power configuration unit. The power supply port TVCC of the transmitting end TX becomes the power supply VCCT of the internal transmitting end TX after passing through the resistor $R_D$.

Referring to the configuration scheme 4 as shown in FIG. 9, the voltage difference generating component is a Schottky diode SBD; a voltage difference value $VF_{SBD}$ of the voltage difference generating component is between 100 mV-600 mV, and a voltage of the internal power supply voltage port VCCT of the transmitting unit TX is $3.3V-VF_{SBD}$. The configuration scheme of FIG. 9 is also an extension of the configuration scheme of FIG. 7. The programmable module can freely configure the voltage difference between the two ends of the Schottky diode SBD, so that the output eye diagram can achieve the best performance.

The resistance value of the resistor $R_D$ or the voltage difference between two ends of the Schottky diode SBD is rewritten by the programmable module, and the programmable module adopts analog programmable module or digital programmable module.

The digital programmable module is realized by a one-time programmable OTP or register programming, and a process of voltage difference adjustment is: first determine a pre-realized voltage difference value between the two working power supplies, then write digital characters as commands through the modulation port CTL of the transmitting unit TX, the resistance value of the resistor $R_D$ or the voltage difference between the two ends of the Schottky diode SBD are rewritten by the programmable module according to this command, and hence the voltage difference adjustment is realized.

The analog programmable modules is realized by laser trimming or fuse trimming.

The eye diagram after using the internal power supply configuration unit in this embodiment is also very good, and its principle is similar to the embodiment 1.

What is claimed is:

1. A DFB laser DC-coupled output power configuration scheme, characterized in that, said power configuration scheme comprising: an external power configuration unit for providing two electric DC power supplies with a fixed voltage difference for a DFB laser and a transmitting unit TX of an optical transceiver integrated chip,
   said external power configuration unit comprises a DC voltage source VDC3.3V and a voltage difference generating component, and a positive terminal of the DC voltage source VDC is connected to both one end of the voltage difference generating component and a power supply voltage port LVCC of said DFB laser DFB_Laser;
   a negative terminal of the DC voltage source VDC is grounded;
   another end of the voltage difference generating component is connected to a power supply voltage port TVCC of the transmitting unit TX of the optical transceiver integrated chip;
   said power configuration scheme optimizes said transmitting unit TX at the same time, the optimization scheme is that: said transmitting unit TX comprises transistors which are all low-voltage high-speed tubes, and said transmitting unit TX comprises a negative capacitance structure composed of capacitors C1 and C2 serving as an auxiliary structure for improving bandwidth;
   a minimum voltage of said power supply voltage port TVCC of said transmitting unit TX is 2.7V after optimization.

2. The DFB laser DC-coupled output power configuration scheme according to claim 1, characterized in that, said voltage difference generating component is a resistor $R_D$, a voltage difference value $VR_D$ generated by said resistor $R_D$ is between 100 mV-600 mV, and a voltage of said power supply voltage port TVCC of said transmitting unit TX is $3.3V-VR_D$;
   said resistor $R_D$ is a single resistor, or is composed of multiple resistors connected in series, in parallel, or in series and parallel.

3. The DFB laser DC-coupled output power configuration scheme according to claim 1, characterized in that, said voltage difference generating component is a Schottky diode SBD; a voltage difference value $VF_{SBD}$ generated by said Schottky diode SBD is between 100 mV-600 mV, and a voltage of the power supply voltage port TVCC of said transmitting unit TX is $3.3V-VF_{SBD}$;
   said Schottky diode SBD is a single tube, or is composed of multiple Schottky diodes connected in series or in parallel.

4. A DFB laser DC-coupled output power configuration scheme, characterized in that, said power configuration scheme is:
- a DC voltage source VDC3.3V is utilized as a working power supply of a DFB laser;
- an internal power configuration unit is arranged inside an optical transceiver integrated chip, and a working power supply of a transmitting unit TX of said optical transceiver integrated chip is obtained from said DC voltage source VDC3.3V after being processed by said internal power supply configuration unit;
- in order to realize that: said working power supply of said transmitting unit TX of said optical transceiver integrated chip and said working power supply of said DFB laser DFB_Laser have a fixed voltage difference;
- specifically: a positive terminal of the DC voltage source VDC3.3V is both connected to a power supply voltage port LVCC of said DFB laser DFB_Laser and a power supply voltage port TVCC of the transmitting unit TX of the optical transceiver integrated chip; a negative terminal of said DC voltage source VDC3.3V is grounded; an input terminal of an internal power configuration unit is connected to said power supply voltage port TVCC of said transmitting unit TX, an output terminal of said internal power configuration unit is connected to an internal working power port VCCT of the transmitting unit TX, a voltage differential modulation terminal of said internal power configuration unit is connected to a modulation port CTL of said transmitting unit TX;
- said power configuration scheme optimizes said transmitting unit TX at the same time, the optimization scheme is that: said transmitting unit TX comprises transistors which are all low-voltage high-speed tubes, and said transmitting unit TX comprises a negative capacitance structure composed of capacitors C1 and C2 serving as an auxiliary structure for improving bandwidth;
- a minimum voltage of said internal power supply voltage port VCCT of said transmitting unit TX is 2.7V after optimization.

5. The DFB laser DC-coupled output power configuration scheme according to claim 4, characterized in that, said internal power supply configuration unit comprises a voltage difference generating component and a programmable module,
- an input terminal of said voltage difference generating component is connected to said power supply voltage port TVCC of said transmitting unit TX, an output terminal of said voltage difference generating component is connected to said internal working power port VCCT of said transmitting unit TX, a voltage difference modulation terminal of said voltage difference generating component is connected to a command output terminal of said programmable module, a command input terminal of said programmable module is connected to a modulation port CTL of said transmitting unit TX, and a voltage difference generated by said voltage difference generating component is adjusted externally by a command input through said modulation port CTL.

6. The DFB laser DC-coupled output power configuration scheme according to claim 5, characterized in that, said voltage difference generating component is a resistor $R_D$, a voltage difference value $V_{RA}$ generated by said resistor $R_D$ is between 100 mV-600 mV, and a voltage of said internal power supply voltage port VCCT of said transmitting unit TX is $3.3V-VR_D$.

7. The DFB laser DC-coupled output power configuration scheme according to claim 5, characterized in that, said voltage difference generating component is a Schottky diode SBD; a voltage difference value $VF_{SBD}$ of said voltage difference generating component is between 100 mV-600 mV, and a voltage of said internal power supply voltage port VCCT of said transmitting unit TX is $3.3V-VF_{SBD}$.

8. The DFB laser DC-coupled output power configuration scheme according to claim 7, characterized in that, a voltage difference between two ends of said Schottky diode SBD is rewritten by said programmable module to realize an adjustment of said voltage difference between said two working power supplies, said programmable module adopts analog programmable module or digital programmable module.

9. The DFB laser DC-coupled output power configuration scheme according to claim 8, characterized in that, said digital programmable module is realized by a one-time programmable OTP or register programming, and a process of voltage difference adjustment is: first determine a pre-realized voltage difference value between said two working power supplies, then write digital characters as commands through said modulation port CTL of said transmitting unit TX, said resistance value of said resistor $R_D$ or said voltage difference between said two ends of said Schottky diode SBD are rewritten by said programmable module according to this command, and hence said voltage difference adjustment is realized.

10. The DFB laser DC-coupled output power configuration scheme according to claim 8, characterized in that, said analog programmable modules is realized by laser trimming or fuse trimming.

* * * * *